United States Patent [19]

Ahlskog

[11] Patent Number: 5,271,514
[45] Date of Patent: Dec. 21, 1993

[54] CONTROL STATION PROTECTIVE COVER

[76] Inventor: Christian V. Ahlskog, 4206-149 St. Edmonton, Alberta, Canada

[21] Appl. No.: 831,349

[22] Filed: Feb. 5, 1992

Related U.S. Application Data

[63] Continuation of Ser. No. 611,786, Nov. 13, 1990, abandoned.

[51] Int. Cl.$^5$ .................... B65D 51/18; B65D 53/00
[52] U.S. Cl. .................... 220/3.8; 220/3.3; 220/3.94; 220/4.22; 220/256; 220/259; 220/334; 220/344; 220/358; 220/377; 220/480; 439/142
[58] Field of Search .......... 220/3.3, 3.8, 3.9, 3.92, 220/3.94, 4.02, 4.22, 4.23, 242, 254, 256, 259, 334, 344, 356, 357, 358, 377, 480; 174/57, 67; 439/135, 136, 142

[56] References Cited

U.S. PATENT DOCUMENTS

| | | | |
|---|---|---|---|
| 1,815,855 | 7/1931 | Lauritano | 220/3.3 X |
| 2,250,977 | 7/1941 | Walker | 220/3.8 |
| 2,603,546 | 7/1952 | Lais | 220/334 X |
| 3,923,197 | 12/1975 | Kuhn | 220/344 |
| 3,945,530 | 3/1976 | Bozich | 220/329 |
| 4,036,396 | 7/1977 | Kennedy et al. | 220/242 |
| 4,199,072 | 4/1980 | Jacks | 220/3.4 |
| 4,415,044 | 11/1983 | Davis | 439/142 X |
| 4,469,238 | 9/1984 | Ranalli | 220/254 |
| 5,077,452 | 12/1991 | Mathers et al. | 220/3.8 X |
| 5,118,001 | 6/1992 | Gambill | 220/344 |

*Primary Examiner*—Allan N. Shoap
*Assistant Examiner*—Vanessa Caretto

[57] ABSTRACT

The main theme in the design of this invention is to provide adequate protection while allowing for easy installation and removal without interrupting the operation of the device which is being protected. The two most important components of this invention are the use of resilient clips on the side walls with each clip having a leg extending inwardly allowing this leg to be inserted between the device and the surface, the second important component is the use of gasket material between the frame and the device to be protected. This combination allows for protection from the elements and from accidental operation even without either open end being covered.

1 Claim, 3 Drawing Sheets

CONTROL STATION PROTECTIVE COVER

This is a continuation of application Ser. No. 07/611,786, filed Nov. 13, 1990, and now abandoned.

FIELD OF THE INVENTION

This invention relates to covers for all types of electrical and electronic control stations.

BACKGROUND OF THE INVENTION

The Industrial environment contains electrical and electronic control devices that are subject to many and various destructive elements. These elements include Oil, Water, Steam, Corrosive Fluids, Dirt, Dust, Sand and Mud. The distinct possibility for damage due to bumping, banging and accidental operation is a constant worry. The control stations that we are concerned with are the control stations that are already installed and operating. This invention helps satisfy the need for an easy to install cover than can and does protect the devices from most or all of the above mentioned problems.

Equipment covers are shown in the following United States Patents. However, none of these covers show the features of my invention.

Kramer *Covers for Electrical Receptacles* U.S. Pat. No. 4,197,959 shows a cover having what appears to be three individual plastic or other material pieces. A relatively flat back bottom piece to which is mounted by way of screwing together a flat top piece which has mounted to it a rectangular cover. Any device being contained by this cover would fit inside the flip up cover itself. This device incorporates a gasket between the back plate and the top piece. While it appears that this device would offer protection it differs from my invention in the following obvious ways. 1-The flip up cover itself does not appear to incorporate any gaskets. 2-It is screwed together. This would constitute usage only on new installations, or, would incorporate a high labor cost of installation on existing installations. Installing this device on an operating device may constitute the shut down of the device during installation thereby increasing the cost of installation even further. 3-Because of the design of the invention it requires the device being protected to be physically mounted within the cover.

Seeger *Enclosing casings for electrical control apparatus* U.S. Pat. No. 2,792,143 shows a cover having what appears to be two distinct individual pieces. The first piece is a back plate of heavy gauge thickness. This indicates that the device being covered is firmly mounted to this back-plate and within the cover. The "U" shaped cover is then mounted by way of hinges to one side of this back-plate and by thumb screws to the opposite side. While it appears that this device would offer protection it differs from my invention in the following ways. 1-This invention does not incorporate any gaskets. 2-This invention has a back box with a heavy gauge back-plate which means that the device to be protected would have to be mounted within the back box. This would constitute usage only on new installations, or, would exact a high labor cost when installed on existing installations. The design of this invention appears to require that any equipment being covered would have to be shut down and disconnected during installation of this protective cover.

Juvinall *Electric Meter Cover* U.S. Pat. No. 2,008,104 shows a cover having what appears to be two distinct sections. A back section containing four walls and a bottom. A front section which incorporates a window. The back section incorporates mounting lugs and various size knock outs. In this invention the meter or other device is mounted within the back section. While it appears that this invention would offer protection it differs from my invention in the following ways. 1-This invention does not incorporate any gaskets. 2-This invention requires the device to be protected to be mounted within the cover. This would constitute usage only on new installations, or, would exact a high labor charge when installed on existing installations. The design of this invention would require that the device to be protected be shut off and disconnected from the conduit and power wires until after installation then re-connected.

SUMMARY OF THE INVENTION

This invention provides a cover assembly for a control station comprising two distinct sections. A substantially rectangular, but not restricted to rectangular, open ended back box and a hinge connecting it to a top cover complete with gasket that is designed to exactly fit the back box. This top cover may be held tight to the back box with latches, locks, friction type plastic or metal bubbles or simply by gravity. The back box incorporates a design that is notched in such a way as to not interfere with the conduit entering the control station. The back box has a gasket situated in such a way as to create a barrier to the ingress of water, steam, dust etc. thru the opening at the bottom of the four sides. The back box also incorporates the use of two sprung latches secured to the back box and installed in such a way as to allow the latches to be pulled to the side during installation and to be pushed under the control station after installation. The back box is held to the control station thru the dual use of the sprung latches and the friction fit caused by the compression of the mid point sealing gasket. The cover is attached to the back box by means of hinges. The cover has a gasket attached to the open end and situated so as to create a barrier to the ingress of water, steam, dust etc. thru the opening created between the back box and the top cover. This cover may have an apron around the opening perimeter which overlaps the gasket and a portion of the back box. This increases the ability of the cover to keep out water and steam even when they are under a certain amount of pressure. This apron has twin bubbles of plastic that fit into hollow areas located in the back box thereby securely holding the top cover in place. The back box and the top cover are supplied with a protruding ledge which will facilitate in the opening of the top cover. This ledge can be drilled to allow the top and bottom sections to be locked in a closed position. This cover must be made of a material which is strong enough to withstand the rigors which can reasonably be expected in the industrial field, e.g.: steel, aluminum, fiberglass, plastic, plexi glass etc.

BRIEF DESCRIPTION OF THE DRAWINGS

There will now be described a preferred embodiment of the invention, with reference to the drawings, by way of illustration, in which like numerals denote like elements and in which:

Referring to FIGS. 1, 2, and 3, the Description is as follows. Item 1 shows the top cover or closure. This cover is designed to fit exactly to the back box. The cover is the same geometric design as the back box and may be either a raised box design. Item 2 shows the back box. This back box or frame has an open ended top and bottom. The back box is built to exacting measurements for each style or manufacture of control station. Item 3 is the hinge that joins the top cover to the back box thereby allowing quick and easy access to the control station. This hinge may be Stainless Steel, Aluminum, Plastic or other acceptable material and may be but will not necessarily be of the piano hinge style. Item 4 is the sprung latch or resilient clip. This is made of a flexible material that allows a sideways movement upon installation yet will orient back to the normal position once the cover is in place. This material may be plastic, metal or fiberglass. Item 5 is the midpoint back box gasket. This gasket is positioned so that the conduit opening will not allow ingress of liquid, steam, dirt etc. The gasket may be of any resilient material, preferably a foam silicone rubber. This gasket may sometimes take the form of expanding Polyurethane expanding foam. The gasket must be compressed between the cover and the control station in such a way that it creates a barrier to all liquid, steam etc. and also creates enough friction to assist in holding the back box in place. Item 6 is the top cover gasket. This gasket is positioned at the bottom edge of the top cover. The gasket may be of any resilient material, preferably a foam silicone rubber. This gasket must be wide enough and strong enough to act as a barrier to liquid, steam etc. through the opening between the back box and the top cover. Item 7 is the Apron. The apron serves the dual purpose of giving extra protection to the top cover gasket and providing a place to position the friction bump. Item 8 is the protruding ledge. The purpose of this ledge is to facilitate opening the cover. The ledge allows the operation of lifting the cover and operating the electrical device to be done with only one hand. Item 9 is the conduit opening. This opening is designed to allow the conduit to enter the device box without the need to remove or shut down the control device during installation or removal of the cover. Item 10 is the friction bump or protrusion. This bump clicks into the item 11 hollow thereby securely holding the top cover tight against the back box. This allows the item 6 top cover gasket to do a better job. Item 11 is the hollow or indentation into which the item 10 bump sits. Item 12 is the hole in the protruding ledge which allows the top and bottom portions to be locked in the closed position.

Operation of Preferred Embodiment

Figure 1:
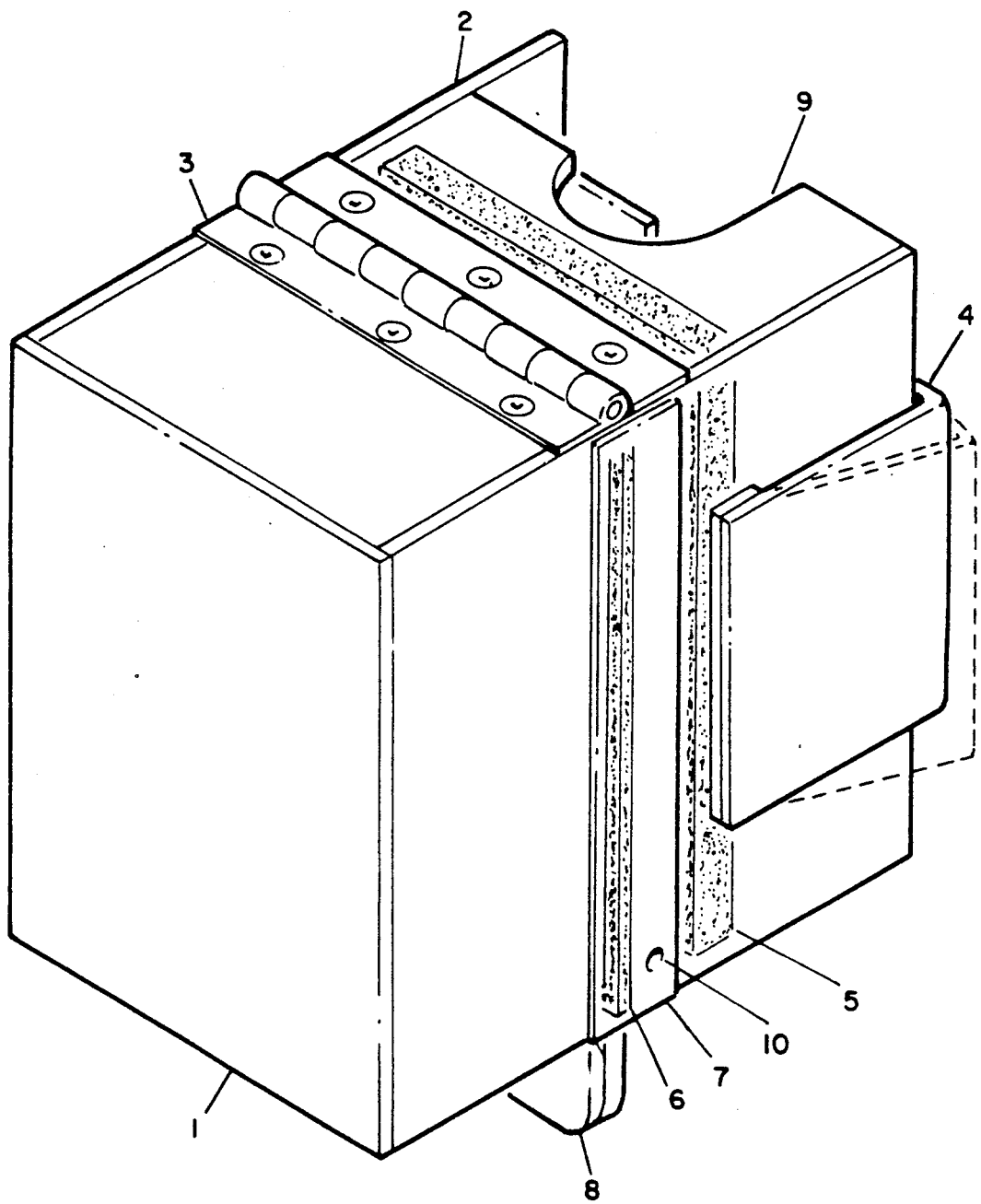
FIG. 1 is a perspective view of a preferred embodiment of the invention.
Figure 2:
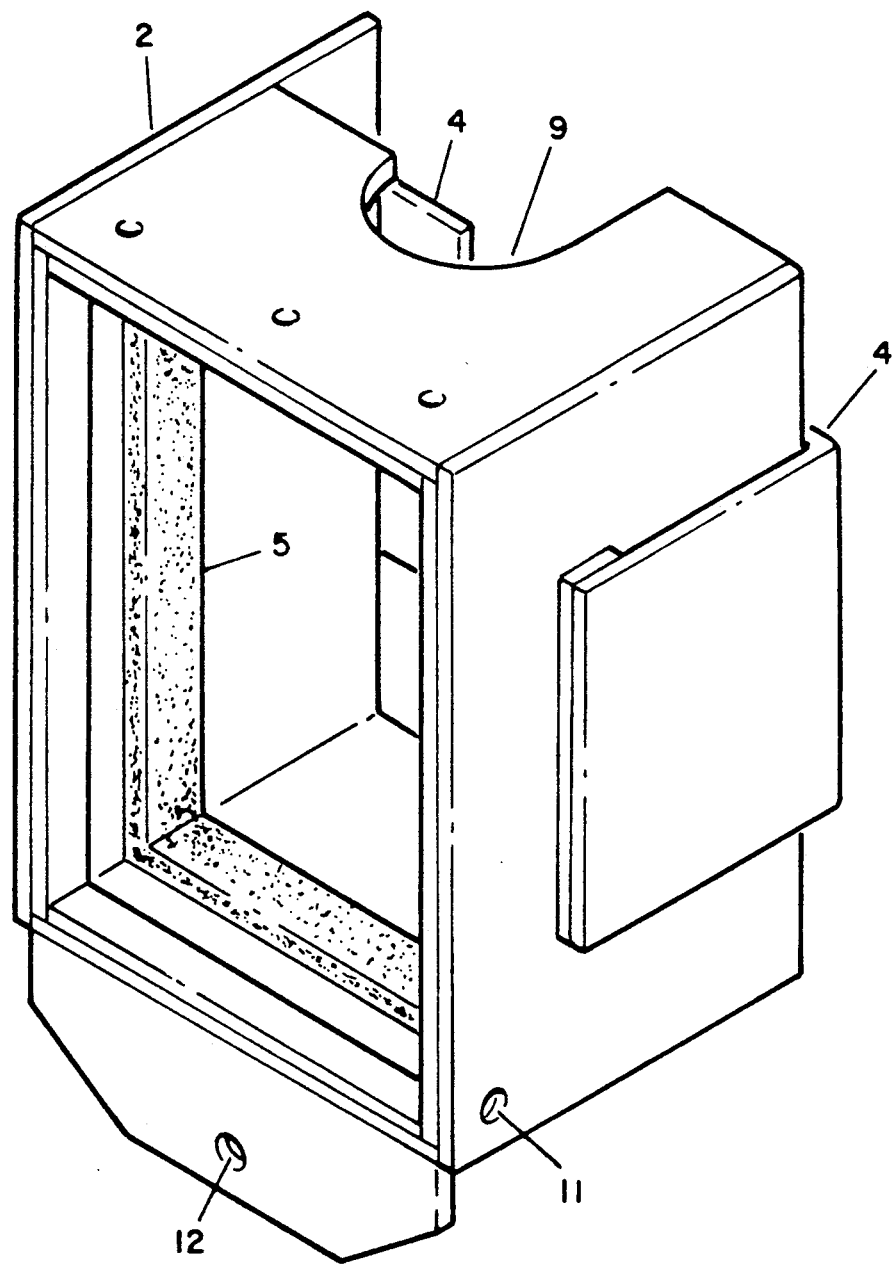
FIG. 2 is a perspective view of the back box only.
Figure 3:
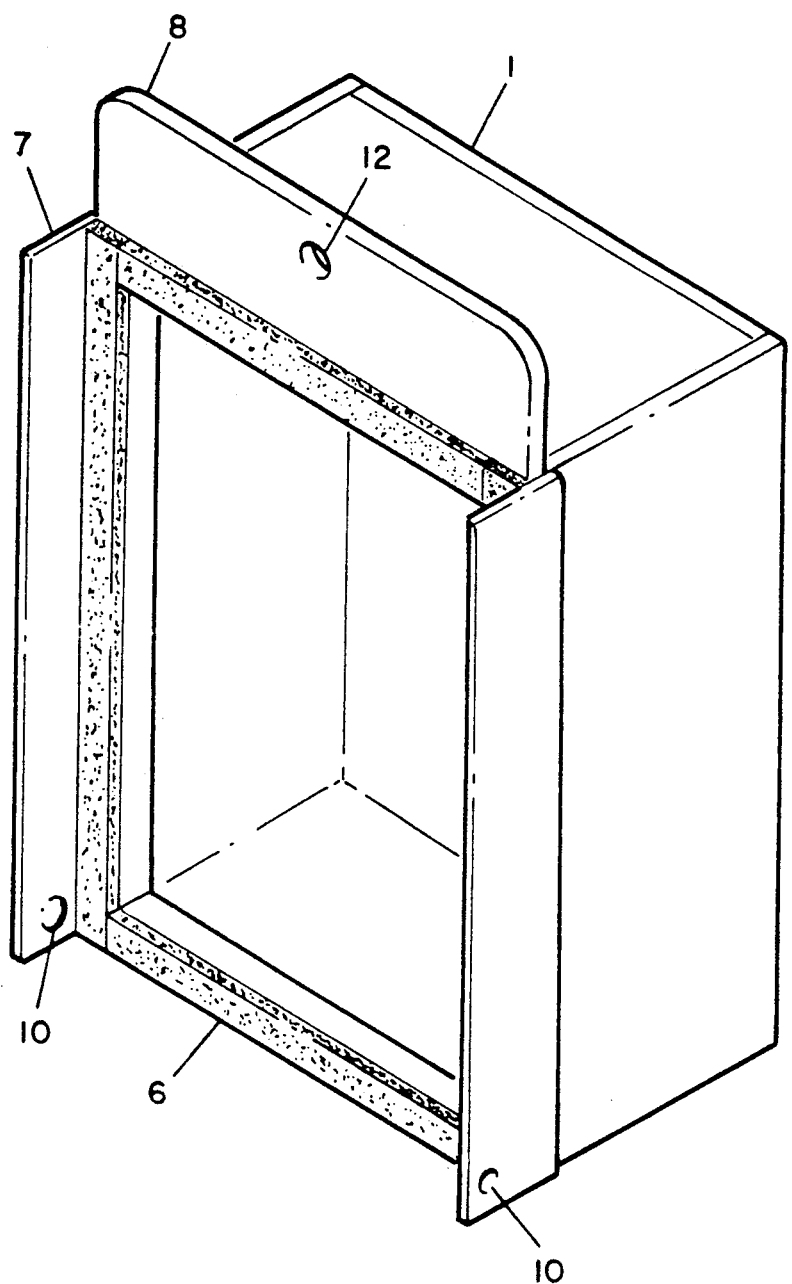
FIG. 3 is a perspective view of the top cover only.

Firstly, an appropriate cover assembly is chosen that fits the subject control station. The sprung latch is grasped and pulled to the side. The gasket are then lined up with the edge of the control device box and the cover is slid into position. After the cover has been completely pushed onto the control device, the sprung latch can then slide back into the normal position. The top cover can then be opened and closed as desired. For maintenance of the control device the cover may be removed simply by again moving the sprung latch to the side and pulling the unit off of the control device. Total time for installation or removal of the cover unit is less than one minute, and either action may be performed without disrupting the operation of the control device.

Alternative Embodiments

A person skilled in the art could make immaterial modifications to the invention described and claimed in this patent without departing from the essence of the invention. This essence being an extremely quick convenient method of providing protection for the operating control station without the need to interrupt the operation of that control station during installation or removal.

I claim:

1. A cover assembly for a control device mounted to a surface, said cover assembly comprising:

a substantially rectangular frame of two pairs of opposed side walls, an open top, and an open bottom; said frame having two resilient clips, a resilient clip being attached to each respective opposed side wall of one of said pairs of said side walls, each of said resilient clips having a leg extending inwardly from said side wall to fit between the surface and the control device to removably secure said cover assembly to the control device; said frame having a length of gasket material mounted on an inside surface of each said side wall and extending the length of each said side wall to seal against the control device, the gasket material on each said side wall functioning to prevent ingress of fluid or particulate matter; said frame having a conduit opening in one of said side walls, the conduit opening extending from an edge of said one side wall closest to the control device;

the cover assembly further comprising a closure hingedly attached to one of said side walls for covering and sealing against said frame, said closure having two pairs of opposed side walls, a top wall, and an open bottom; said closure having a length of gasket material mounted to an inside surface of each said closure side wall and extending the length of each closure side wall, said closure gasket material being located proximate said closure open bottom and functioning to prevent ingress of fluid or particulate matter between said frame and said closure when said frame is covered by said closure; said closure having two apron sections, an apron section extending downwardly from each respective opposed side wall of one of said pairs of said closure side walls, each said apron section overlapping adjacent portions of said frame side walls when said frame is covered by said closure; locking means on one pair of opposed side walls of said frame and said apron sections cooperating with each other, each cooperating locking means comprising a protrusion on one of said frame and said apron section, and an indentation on the other of said frame and said apron section; said frame and said closure each having a laterally outwardly extending ledge protruding from a side wall opposite the hinged connection so that the ledges face each other in close proximity, said ledges having aligned openings for receiving a security means to prevent unauthorized access to said covering assembly.

* * * * *